United States Patent [19]

Akbar et al.

[11] Patent Number: 5,286,334
[45] Date of Patent: Feb. 15, 1994

[54] NONSELECTIVE GERMANIUM DEPOSITION BY UHV/CVD

[75] Inventors: Shahzad Akbar, Poughkeepsie; Jack O. Chu, Astoria; Brian Cunningham, Highland; Gregory Fitzgibbon, Hopewell Junction; Somnuk Ratanaphanyarat, Poughkeepsie, all of N.Y.

[73] Assignee: International Business Machines Corporation, Armonk, N.Y.

[21] Appl. No.: 779,677

[22] Filed: Oct. 21, 1991

[51] Int. Cl.$^5$ ............................................ C30B 25/00
[52] U.S. Cl. ........................................ 156/62; 156/603; 156/613; 437/946
[58] Field of Search ............... 148/DIG. 59; 156/603, 156/612, 613; 437/131, 946

[56] References Cited

U.S. PATENT DOCUMENTS

| 2,780,569 | 2/1957 | Hewlett | 148/1.5 |
|---|---|---|---|
| 3,473,978 | 10/1969 | Jackson, Jr. | 148/175 |
| 4,220,959 | 9/1980 | Kroger | 357/7 |
| 4,278,830 | 7/1981 | Frosch et al. | 136/255 |
| 4,321,099 | 3/1982 | Frosch et al. | 148/175 |
| 4,521,794 | 6/1985 | Murase et al. | 357/2 |
| 4,529,455 | 7/1985 | Bean | 148/175 |
| 4,681,640 | 7/1987 | Stanley | 148/1.5 |
| 4,861,393 | 8/1989 | Bean | 148/33.4 |

FOREIGN PATENT DOCUMENTS

| 0140813 | 7/1985 | Japan. |
|---|---|---|
| 0179113 | 8/1987 | Japan. |
| 0140521 | 6/1988 | Japan. |
| 0005011 | 1/1989 | Japan. |

OTHER PUBLICATIONS

"The heteroepitaxy of Ge on Si: A comparison of chemical vapor and vacuum deposited layers", by M. Maenpaa, et al., J. Appl. Phys., Feb. 1982, pp. 1076–1083.
"Low-temperature silicon epitaxy by ultrahigh vacuum/chemical vapor deposition", by B. S. Meyerson, Appl. Phys. Lett., 24 Mar. 1986, pp. 797–799.
"Low Temperature Silicon Epitaxy by Hot Wall Ultrahigh Vacuum/Low Pressure Chemical Vapor Deposition Techniques: Surface Optimization", by B. S. Meyerson, et al., Journal of the Electrochemical Society, vol. 133, No. 6, Jun. 1986, pp. 1232–1235.
"Cooperative growth phenomena in silicon/germanium low-temperature epitaxy", by B. S. Meyerson, et al., Appl. Phys. Lett. 53, 19 Dec. 1988, pp. 2555–2557.
"Growth of Epitaxial Layers of $Ge_xSi_{1-x}$ by UHV/CVD", by Marco Racanelli, et al., Mat. Res. Soc. Symp. Proc., vol. 198, pp. 527–532 (1990).
"Influence of surfactants in Ge and Si epitaxy on Si(001)", by M. Copel, et al., Physical Review B, vol. 42, No. 18, 15 Dec. 1990-II, pp. 11682–11690.

Primary Examiner—Olik Chaudhuri
Assistant Examiner—Felisa Garrett
Attorney, Agent, or Firm—Michael J. Balconi-Lamica; Richard A. Romanchik

[57] ABSTRACT

A method of depositing Ge on a Si substrate in a reaction chamber includes the steps of: precleaning the substrate; evacuating the chamber to a pressure below $10^{-7}$ Torr; heating the substrate to 300°–600° C.; and providing a $GeH_4/B_2H_6/He$ mixture of gas with a $GeH_4$ partial pressure of 2–50 mTorr and a $B_2H_6$ partial pressure of 0.08 to 2 mTorr.

8 Claims, 9 Drawing Sheets

NONSELECTIVE GERMANIUM DEPOSITION BY UHV/CVD

TECHNICAL FIELD

This invention relates to semiconductor manufacturing processes, and more particularly, a method of growing germanium (Ge) by a low temperature, UHV/CVD process.

BACKGROUND ART

Germanium (Ge) has many characteristics which render it a highly desirable material for integration into semiconductor structures. Some of the useful properties of Ge are that it has a smaller bandgap than silicon (Si), yet is has about three orders of magnitude higher intrinsic carrier concentration and therefore a higher conductivity. It has a low dopant activation temperature and doesn't require special processing for activation. It can be used as a dopant source and it is optically active. For these reasons, Ge has many potential uses, such as a replacement material in many applications where polycrystalline silicon has previously been utilized. A potential disadvantage of Ge, however, is that it exhibits intrinsically selective growth over Si. In other words, Ge will grow on Si but will not grow on a number of other mediums, such as oxides.

A number of techniques have emerged for depositing Ge on substrates, including chemical vapor deposition (CVD), laser induced chemical vapor deposition (LICVD) and ultra high vacuum chemical vapor deposition (UHV/CVD).

Examples of prior deposition methods for growing Ge utilizing CVD are disclosed in the following publications.

Maenpaa, et al., "The heteroepitaxy of Ge on Si: A comparison of chemical vapor and vacuum deposited layers", J. Appl. Phys. 53(2), (February 1982), 1076–1083, (Maenpaa et al.) describes a CVD experiment performed utilizing $GeH_4$ as a carrier gas with a pressure of 2-13 Torr and maintaining the Si temperature between 500°-900° C.

Hitoshi Ishii, "Manufacture of Semiconductor Device and Equipment Therefor", Japanese Patent publication 62-179113, application no. 61-20283, (Ishii) discloses the deposition of Ge using $GeH_4$ as a carrier gas in a CVD chamber at 450° C.

U.S. Pat. No. 3,473,978 (Jackson), entitled "Epitaxial Growth of Germanium", teaches a method for the nucleation and growth of monocrystalline germanium on a Si substrate which comprises epitaxially growing a layer of monocrystalline Si at a temperature of at least 900° C., then cooling the Si below 670° C., followed by the nucleation and growth of Ge.

An example of a LICVD technique for depositing Ge is disclosed in U.S. Pat. No. 4,681,640 (Stanley) wherein polycrystalline Germanium films are formed by irradiating germane related compounds with $CO_2$ laser energy at pressures above 3.5 Torr.

Examples of UHV/CVD techniques for depositing $Ge_xSi_{1-x}$ alloys are disclosed in the following references.

Meyerson, Uram and LeGoues, "Cooperative growth phenomena in silicon/germanium low-temperature epitaxy", (Appl. Phys. Lett. 53 (25), 19 Dec. 1988, 1988 American Institute of Physics), (MEYERSON ET AL.), which teaches deposition of alloys of composition $0 \leq Ge/Si \leq 0.20$ using UHV/CVD and a temperature of 550° C.

Racanelli and Greve, "Growth of Epitaxial Layers of $Ge_xSi_{1-x}$ by UHV/CVD", (Mat. Res. Soc. Symp. Proc. Vol. 198, 1990 Materials Research Society), (RACANELLI et al.), which teaches a method of growing epitaxial layers of a $Ge_xSi_{1-x}$ composition on Si at temperatures between 577° and 665° C.

None of the aforementioned CVD or UHV/CVD references, however, describes a practical method for growing Ge on monocrystalline Si in a manufacturing environment. In addition, all of the prior methods teach growing Ge over only Si related semiconductor mediums. A practical method for growing Ge nonselectively over other materials, such as oxides in a high throughput manufacturing environment is highly desirable.

DISCLOSURE OF THE INVENTION

An object of the present invention is to provide a method of growing Ge films.

Another object of the present invention is to provide a method of growing Ge films wherein the deposited Ge has a continuous surface morphology.

Another object of the present invention is to provide a method of growing Ge films nonselectively over a multitude of mediums, including insulators, such as oxides.

Yet another object of the present invention is to provide a method of growing Ge films utilizing low pressures and low temperatures.

According to the present invention, a UHV/CVD process is utilized to induce nonselective growth of Ge films using temperatures less than 600° C. and pressures of about 120 mTorr and utilizing a $B_2H_6/GeH_4$ gas mixture with a minimum partial pressure ratio of 1:25.

The present invention facilitates the growth of Ge films having a surface morphology which is sufficiently smooth to allow subsequent growth of Ge or other thin films required for device applications.

These and other objects, features and advantages of the present invention will become more apparent in light of the detailed description of exemplary embodiments thereof as illustrated by the drawing.

BEST MODE FOR CARRYING OUT THE INVENTION

Figure 1:
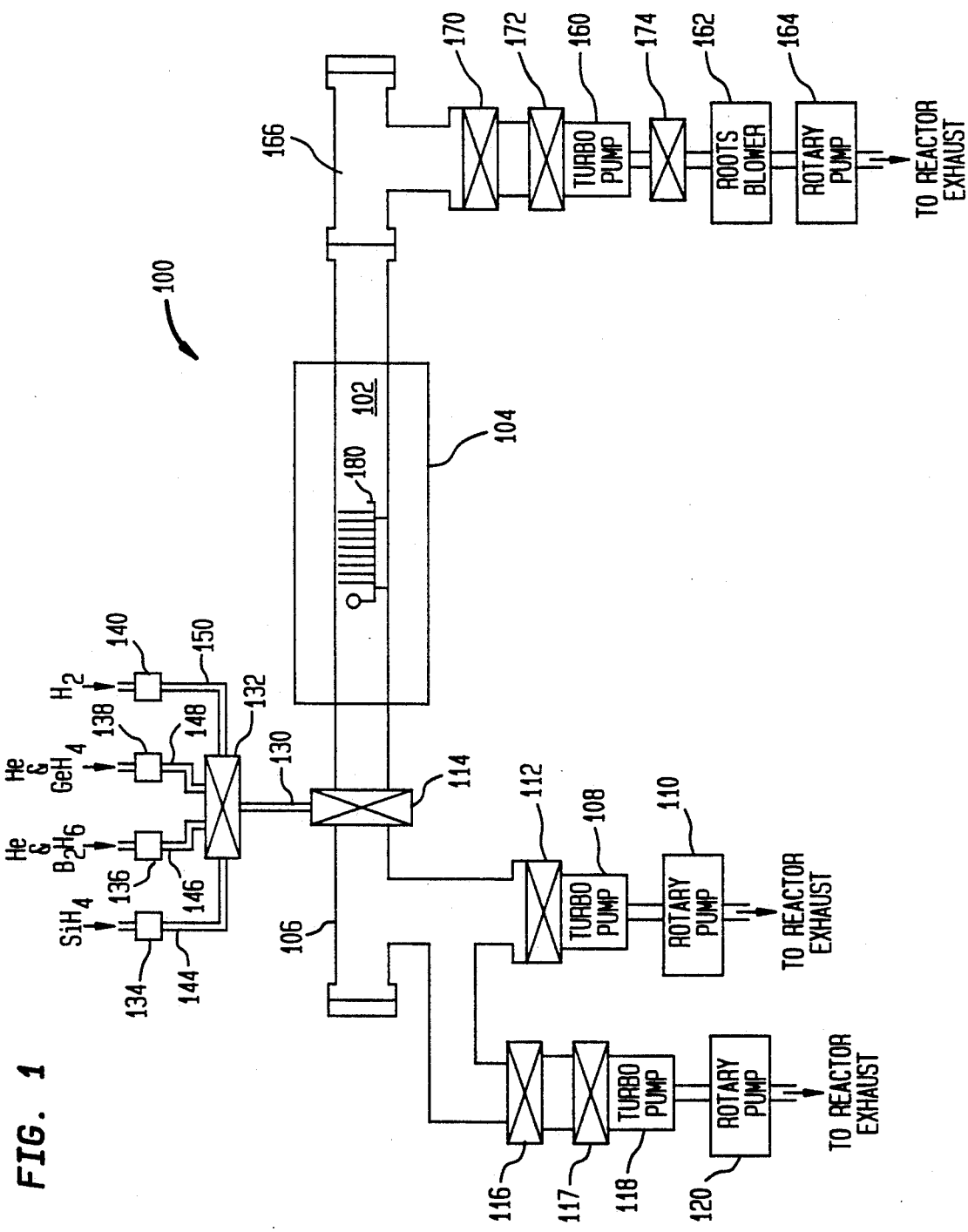
FIG. 1 is a simplified schematic block diagram of the UHV/CVD system utilized for the method of the present invention.

Referring now to FIG. 1, the UHV/CVD system 100 utilized for carrying out the process of the present invention includes a quartz reaction chamber 102, a furnace 104, which surrounds the quartz reaction chamber 102, and a load lock chamber 106. Chamber 102, furnace 104 and load lock chamber 106 may be any of a number of suitable UHV/CVD systems known in the art. A valve 114, such as part number 10746-CE44 manufactured by VAT Inc. of Woburn, Mass., isolates the load lock chamber 106 from the reaction chamber 102. A valve 112 similar to valve 114 isolates the load lock chamber 106 from a pair of evacuation pumps 108, 110, such as part numbers TMP 1500 and D65-BCS, respectively, manufactured by Leybold Vacuum Products of Export, Pa., which are in series with the load lock chamber and are utilized to evacuate the chamber 106. A bypass valve 116, similar to valve 114, and a metering valve 117, such as Model Number SS-4BMRW made by the Nupro Corporation of Willoughby, Ohio, are utilized to isolate the load lock chamber 106 from a pair of evacuation pumps 118, 120, part numbers TMP 450 and D65-BCS, respectively, which are manufactured by Leybold Vacuum Products of Export, Pa. which are also in series with the load lock chamber 106 and utilized to pre-evacuate the chamber 106. Gas is provided to valve 114 from a valve 132 through a gas line 130. Valve 132 controls the mixture of gas coming from four different sources (not shown). Silane ($SiH_4$) is provided through a flow controller 134 and a gas line 144. A 99% He and 1% $B_2H_6$ mixture is provided through a flow controller 136 and a gas line 146. A 10% $GeH_4$ and 90% He mixture is provided through a flow controller 138 and a gas line 148. $H_2$ is provided through a flow controller 140 and gas line 150. The flow controllers may be any of a number known in the art such as part number 1449A manufactured by MKS Instruments Inc. of Andover, Md. A series of three pumps, 160, 162, 164, exhaust gas from the reaction chamber 102 via an evacuation chamber 166. The pumps 160, 162, and 164 utilized for this application may be part numbers TMP 1500, WS 250, and D65-BCS, respectively, which are manufactured by Leybold Vacuum Products of Export, PA. A throttle valve 170, such as part number 228-0400 manufactured by High Vacuum Apparatus MFG Inc., of Hayward Calif. and a valve 172, similar to valve 114, are connected in series between pump 160 and the evacuation chamber 166. A valve 174, such as Model Number 151-0050K made by HPS Inc., (a division of MKS Instruments Inc. of Andover, Md.) is connected between the pump 162 and pump 160.

Operation of the UHV/CVD system 100 in accordance with the process of the present invention is as follows:

First, wafers having exposed Si surfaces (or substrates) are precleaned using a special cleaning process (hereinafter known as a Huang clean) which is comprised of: a) immersing the wafers in a 5:1:1 solution of $H_2O:H_2O_2:NH_4OH$ at 65° C. for 1 minute followed by a deionized $H_2O$ rinse, and b) immersing the wafers in a 5:1:1 solution of $H_2O:H_2O_2:HCl$ at 65° C. for 1 minute, followed by another deionized water rinse.

Next, the wafers having exposed Si surfaces (or substrates) are etched in a dilute 10:1 HF solution at room temperature for 10 to 15 seconds and then placed on a wafer boat 180 and placed in load lock chamber 106. The load lock chamber 106 is then slowly pre-evacuated through pumps 118, 120 by opening valve 116 and adjusting metering valve 117 to thereby create a pressure of approximately 10 to 50 mTorr in the load lock chamber 106.

It is to be noted that the purpose of the previous two cleaning steps is to remove any native oxide which develop on exposed Si substrate surfaces. If it is unnecessary to remove native oxide from the substrate surface, then these steps may be unnecessary.

Valve 116 is then closed and the load lock chamber 106 is quickly evacuated through valve 112 and pumps 108, 110 to a pressure of approximately $10^{-7}$ Torr.

Next, flow controller 140 bleeds $H_2$ through valve 114 and into the reaction chamber 102 at a rate of approximately 650 sccm.

Next, valve 114 is opened, thereby exposing load lock chamber 106 to the reaction chamber 102 and the wafers are transferred from the load lock chamber 106 to the reaction chamber 102. It is to be noted that the aforementioned flow of hydrogen reduces cross contamination of the two chambers during this wafer transfer process.

It is to be noted that the reaction chamber 102 is maintained at a pressure of about 200-300 mTorr by pumps 160, 162, 164 and valves 170, 172, 174 during the aforementioned wafer transfer steps.

Next, valve 114 is shut, thereby sealing the load lock chamber 106 from the reaction chamber 102.

Next, flow controller 140 stops the flow of $H_2$ and flow controller 138 starts a flow of the He and $GeH_4$ mixture at a rate of approximately 10 to 25 sccm through the reaction chamber 102 which thereby produces a $GeH_4$ partial pressure of approximately 2-50 mTorr. If the temperature of the reaction chamber 102 is maintained at approximately 300°-600° C. growth of Ge occurs.

Under the process conditions described hereinbefore, Ge will selectively grow on Si and will not grow on oxides. Also, the grown Ge will have a relatively rough surface morphology. In order to smooth out the surface morphology and make the Ge growth nonselective over both Si and other surfaces, (such as insulators), flow controller 136 is opened to provide a flow of $B_2H_6$ into the reaction chamber 102. The amount of $B_2H_6$ necessary to accomplish this objective is dependent upon all of the process parameters, including the UHV/CVD system utilized. However, it has been determined that a minimum partial pressure ratio of $B_2H_6$ to $GeH_4$ of 1:25 is required. This ratio therefore correlates with the partial pressure mentioned above for $GeH_4$ to a partial pressure of $B_2H_6$ of approximately 0.08 to 2 mTorr.

The preferred process conditions for a single run with conditions consistent with the exemplary embodiment stated hereinbefore are a reaction chamber temperature of about 500° C., a GeH$_4$/He flow rate of about 20-25 sccm, a total process pressure of about 100-150 mTorr, a GeH$_4$ partial pressure of about 10-20 mTorr and a B$_2$H$_6$ partial pressure of about 0.4-0.8 mTorr.

The aforementioned process with the utilization of B$_2$H$_6$ provides growth of Ge on a variety of substrates, including insulators such as SiO$_2$, Si$_3$N$_4$ and poly Si.

Figure 2:
FIG. 2 is a cross sectional Transmission Electron Micrograph (TEM) of a structure of Ge grown on both monocrystalline Si and $SiO_2$ in accordance with the method of the present invention.

Referring now to FIG. 2, a cross sectional TEM of a Ge film grown by the deposition method of the present invention is shown. The left side of FIG. 2 illustrates deposition on a monocrystalline Si substrate and the right side demonstrates deposition on SiO$_2$. The deposition was run at 500° C. with a GeH$_4$ partial pressure of 8 mTorr and a B$_2$H$_6$ partial pressure of 0.35 mTorr. As can be seen from FIG. 2, the deposited Ge is continuous. It is to be noted that the incubation period prior to growth for the Ge over the oxide results in a thinner Ge layer than that which grows over the Si substrate. As a matter of fact, a deposition rate of about 9-10 angstroms per minute has been observed over oxide surfaces while about a 20 angstroms per minute deposition rate has been observed over monocrystalline Si.

Figure 3:
FIG. 3 is a cross sectional TEM of a structure of Ge grown on both monocrystalline Si and polycrystalline Si in accordance with the method of the present invention.

Referring now to FIG. 3, a cross-sectional TEM of a Ge film grown by the deposition method of the present invention is shown. The left side of FIG. 3 illustrates deposition on a monocrystalline Si substrate and the right side demonstrates deposition on a polycrystalline Si (polysilicon) substrate. The deposition was run at 500° C. with a GeH$_4$ partial pressure of 8 mTorr and a B$_2$H$_6$ partial pressure of 0.35 mTorr. It is to be noted that the incubation period prior to growth for the Ge over the polycrystalline Si is not much different than that of monocrystalline Si. Consequently, the thickness of the Ge remains nearly constant over the two substrates.

Figure 4:
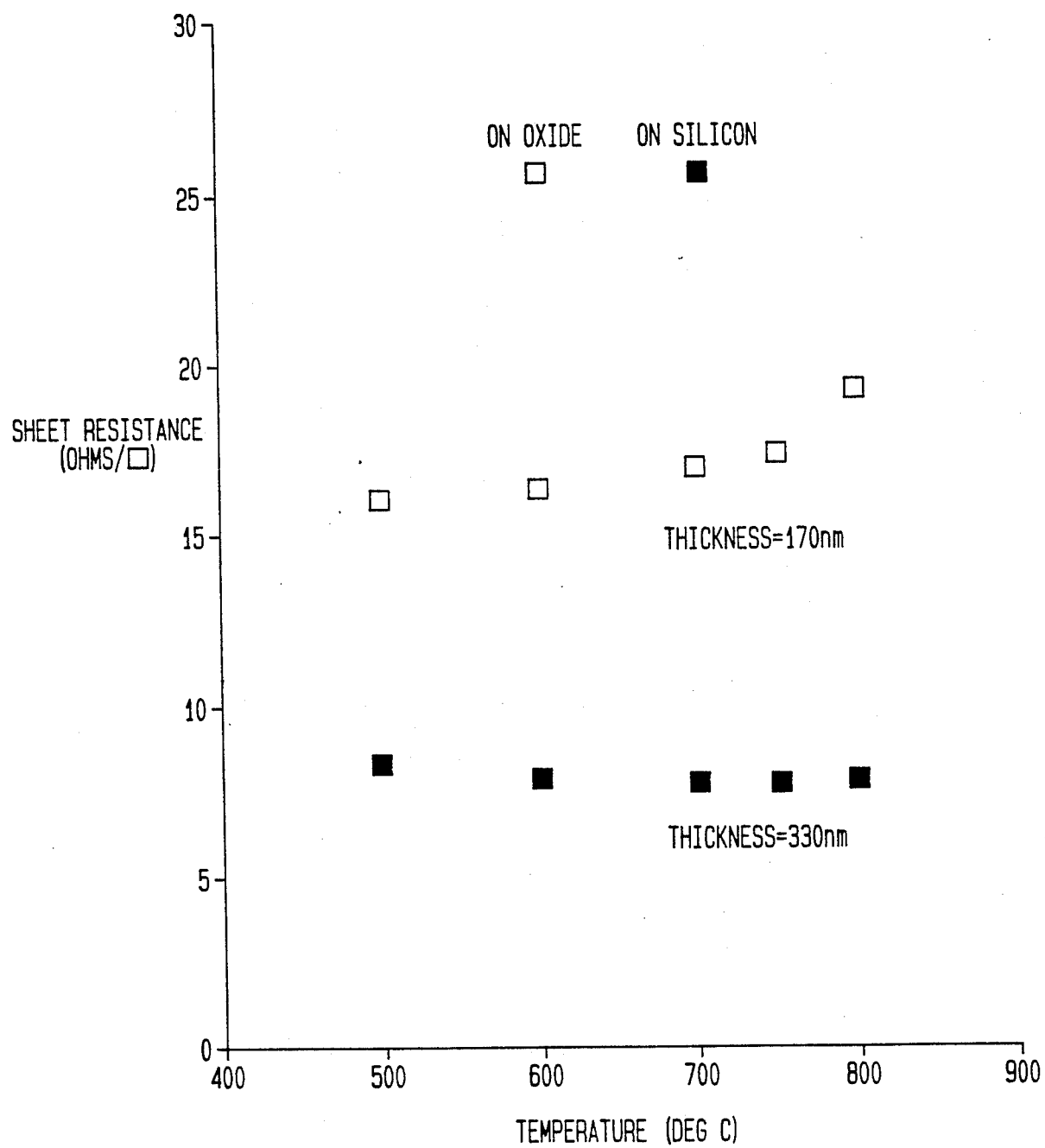
FIG. 4 is a graph of the sheet resistance vs annealing temperature for Ge grown on oxide and Si in accordance with the method of the present invention.

Referring now to FIG. 4, the graph demonstrates that the sheet resistance of in-situ boron doped Ge grown over oxide is about 7 ohms/□ and the same over Si is about 16 ohms/□. This indicates higher electrical conductivity than polysilicon materials. FIG. 4 also demonstrates that the sheet resistance of the deposited Ge stays relatively constant with process temperatures between 400° and 800°. This indicates that the in-situ doped boron is already activated at the deposition temperatures. Therefore, desired sheet resistance may be readily achieved by varying the in-situ boron doping concentration of the Ge film without concern that subsequent annealing steps up to 800° C. will alter the achieved resistance.

Figure 5:
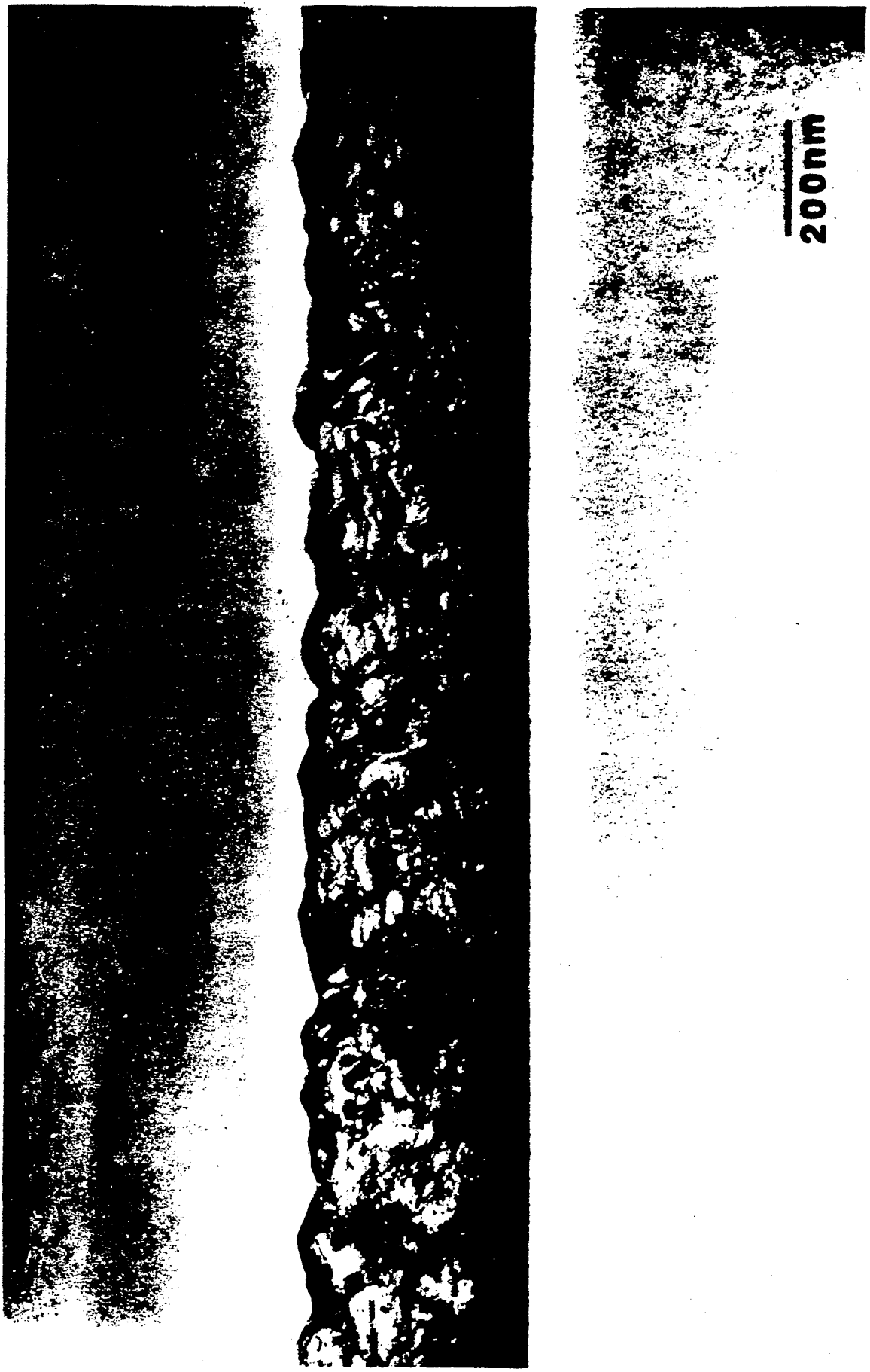
FIG. 5 is a cross sectional TEM of a structure of Ge grown on monocrystalline Si using a relatively small amount of $B_2H_6$ gas in accordance with the method of the present invention.

Referring now to FIG. 5, a cross-sectional TEM of a Ge film grown on a monocrystalline Si substrate by the deposition method in accordance with the present invention is shown. The deposition was run at 500° C. with a partial pressure of GeH$_4$ of 9 mTorr and a partial pressure of B$_2$H$_6$ of 0.4 mTorr.

Figure 6:
FIG. 6 is a cross sectional TEM of a structure of Ge grown on monocrystalline Si using more $B_2H_6$ gas than the structure of FIG. 5 in accordance with the method of the present invention.

Referring now to FIG. 6, a cross-sectional TEM of a Ge film grown on a monocrystalline Si substrate by the deposition method in accordance with the present invention is shown. Considerably more B$_2$H$_6$ was utilized than the process illustrated in FIG. 5. The deposition was run at 350° C. with a partial pressure of GeH$_4$ of 2 mTorr and a partial pressure of B$_2$H$_6$ of 0.18 mTorr.

Figure 7:
FIG. 7 is a cross sectional TEM of a structure of Ge grown on monocrystalline Si first using no $B_2H_6$ gas then adding $B_2H_6$ gas in accordance with the method of the present invention.

Referring now to FIG. 7, a cross-sectional TEM of a Ge film grown on a monocrystalline Si substrate by the deposition method in accordance with the present invention is shown. This structure was obtained by first running the deposition with no B$_2$H$_6$ and then turning on B$_2$H$_6$ to finish the deposition. The process was run at 500° C. with a partial pressure of GeH$_4$ of 8 mTorr and a partial pressure of B$_2$H$_6$ of 0.35 mTorr when the B$_2$H$_6$ was turned on. It can be seen from this Figure that the original Ge being deposited has a rough surface morphology. After the B$_2$H$_6$ was turned on, the surface morphology of the Ge smoothed out and the areas in between the islands were filled in. The deposition then continued in much the same manner as that described and illustrated in FIG. 6.

Figure 8:
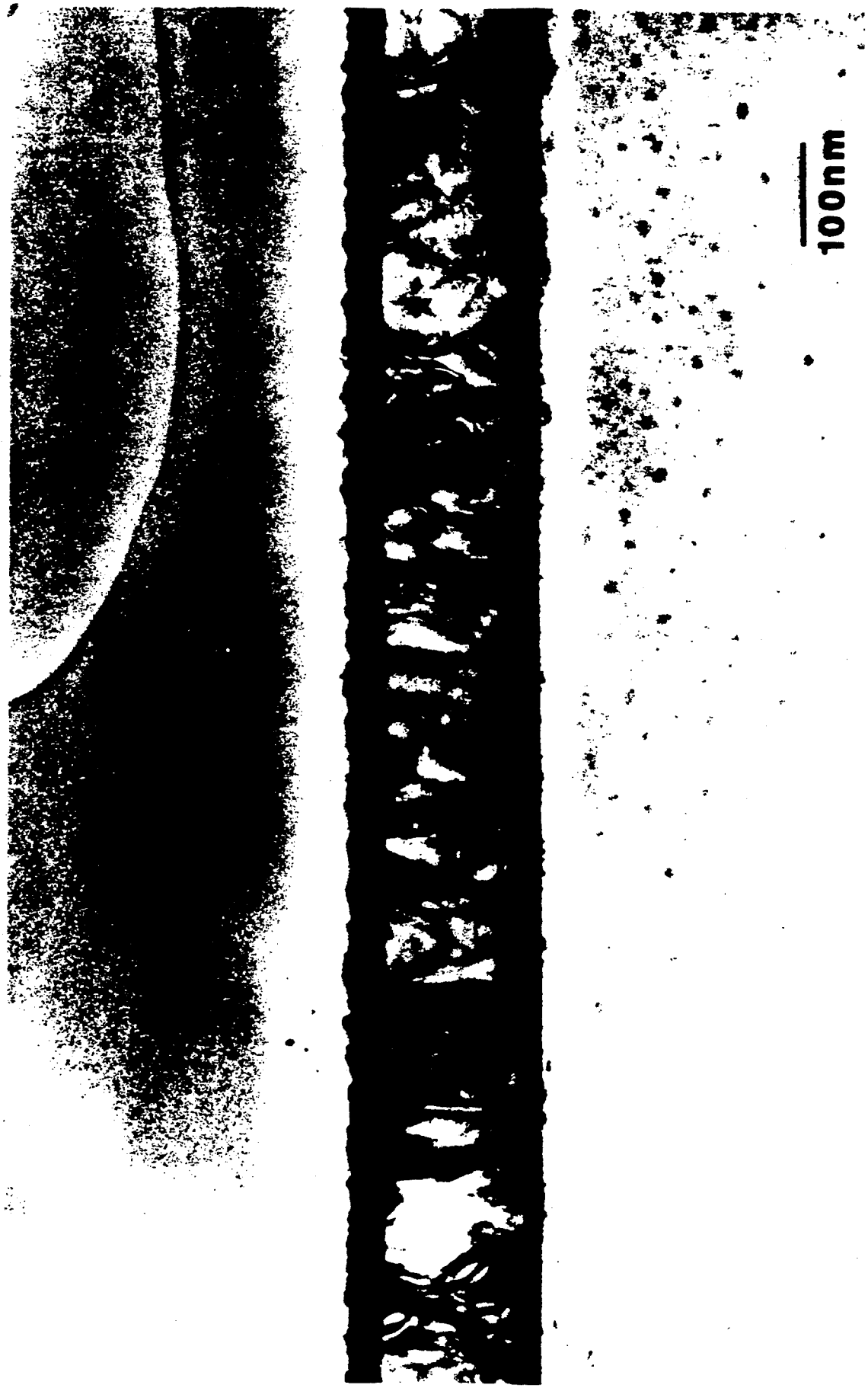
FIG. 8 is a cross sectional TEM of a structure of Ge grown on monocrystalline Si while ramping the amount of $B_2H_6$ gas in accordance with the method of the present invention.

Referring now to FIG. 8, a cross-sectional TEM of a Ge film grown on a monocrystalline Si substrate by the deposition method in accordance with the present invention is shown. The structure shown in FIG. 8 was deposited by ramping the amount of B$_2$H$_6$ utilized from the beginning of the deposition to the end of the deposition. The process was run at 350° C. with a partial pressure of GeH$_4$ of 2 mTorr. The B$_2$H$_6$ was ramped from approximately $10^{-3}$ mTorr to approximately 0.2 mTorr. As can be seen from FIG. 8, the beginning deposition (with relatively small amounts of B$_2$H$_6$) starts out in much the same manner as the beginning deposition for the process illustrated in FIG. 5. The end structure or the top layers of the Ge deposited had greater concentrations of B$_2$H$_6$. Consequently, the top surface morphology looks similar to the structure illustrated in FIG. 6.

Figure 9:
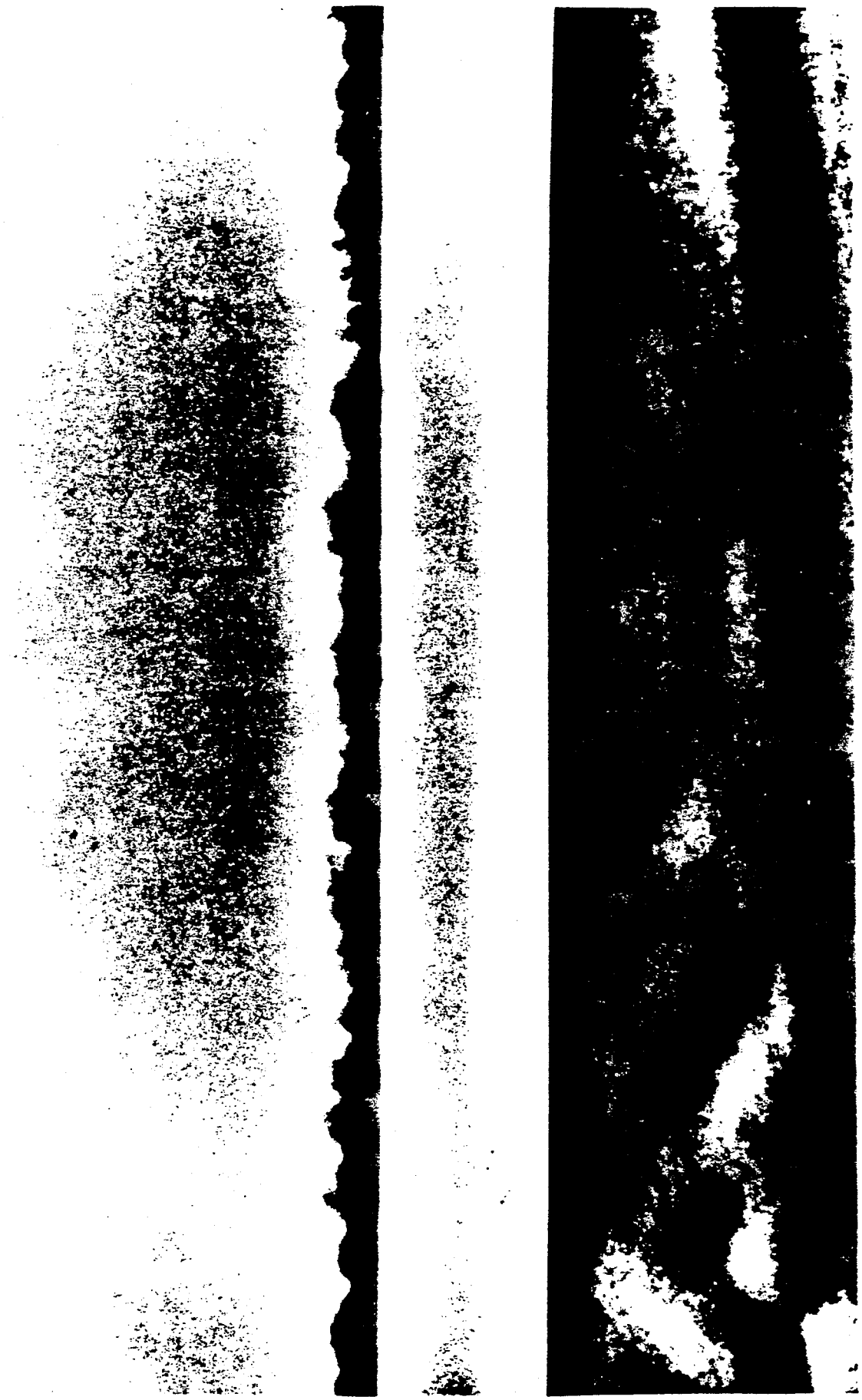
FIG. 9 is a cross sectional TEM of a structure of Ge grown on $SiO_2$ first using no $B_2H_6$ gas then adding $B_2H_6$ gas in accordance with the method of the present invention.

Referring now to FIG. 9, a cross-sectional TEM of a Ge film grown on a SiO$_2$ substrate by the deposition method in accordance with the present invention is shown. This structure was obtained by first running the deposition with a very low amount of B$_2$H$_6$ gas and then quickly raising the amount of B$_2$H$_6$ gas in a step-type function to finish the deposition. The process was run at 350° C. with a partial pressure of GeH$_4$ of 2 mTorr and a partial pressure of B$_2$H$_6$ of about $10^{-3}$ Torr at the start of the deposition and about 0.18 mTorr when the B$_2$H$_6$ was stepped up. It can be seen from this Figure that the lower temperature and lower amounts of B$_2$H$_6$ result in Ge film which has a rough, discontinuous morphology. The rate of deposition for this process was also very slow when compared with the depositions illustrated in FIGS. 2-3 and 5-8.

It is to be noted that no measurable carbon or oxygen impurities were incorporated into the deposited Ge described and illustrated in FIGS. 2-3 and 5-9 hereinbefore. Likewise, no measurable carbon or oxygen was discovered at the Ge/Si interface. The method of the present invention therefore can be utilized to eliminate or control interfacial oxygen at Ge/Si interfaces. It is also to be noted that the surface morphology of structures deposited according to the present invention may be smoothed out and improved even more by annealing subsequent to the deposition. It has been found that an annealing temperature 800° C. is preferable.

It is further to be noted that Ge deposition in accordance with the present invention was carried out on (100) Si surfaces. Other crystal orientation Si surfaces may be utilized, however, as the deposition substrate.

In addition, although Boron is the only dopant specifically utilized hereinbefore for nonselective Ge deposition in accordance with the method of the present invention, other dopants not disclosed hereinbefore may also be utilized for the same purpose.

Although the invention has been shown and described with exemplary embodiments thereof, it should be understood by those skilled in the art that the foregoing and various other changes, omission, and additions may be made therein and thereto without departing from the spirit and the scope of the invention.

We claim:

1. A method of nonselectively depositing Ge onto a substrate in an ultra high vacuum chemical vapor deposition (UHV/CVD) system, the UHV/CVD system comprising a reaction chamber and a load lock chamber, said method comprising the steps of:
   a) placing said substrate in said load lock chamber and pre-evacuating said load lock chamber to a pressure of approximately 10 to 50 mTorr and then subsequently evacuating said load lock chamber quickly to a pressure of approximately $10^{-7}$ Torr;
   b) evacuating said reaction chamber to a pressure below $10^{-7}$ Torr;
   c) bleeding hydrogen ($H_2$) into said reaction chamber at a rate of approximately 650 sccm;
   d) opening said load lock chamber to said reaction chamber and transferring the substrate from said load lock chamber to said reaction chamber, whereby the bleeding of the $H_2$ of the previous step reduces cross contamination between said load lock chamber and said reaction chamber during the transferring of said substrate from said load lock chamber to said reaction chamber;
   e) heating said substrate to a temperature on the order of 300° to 600° C.; and,
   f) stopping the bleeding of $H_2$ and providing a mixture of $GeH_4$, He, and $B_2H_6$ gas in said reaction chamber, wherein a flow of $GeH_4$ and He is at a rate of approximately 10 to 25 sccm to produce a $GeH_4$ partial pressure of approximately 2-50 mTorr and a flow of $B_2H_6$ is at a rate sufficient to produce a $B_2H_6$ partial pressure of approximately 0.08 to 2 mTorr, the mixture thereby having a partial pressure ratio of $GeH_4$ to $B_2H_6$ on the order of 25:1.

2. A method of depositing Ge according to claim 1, wherein said substrate is comprised of Si.

3. A method of depositing Ge according to claim 2, further comprising, prior to step a), the step of immersing the substrate in about a 10:1 solution of $H_2O$:HF at room temperature for about 10 to 15 seconds.

4. A method of depositing Ge according to claim 1, wherein said substrate is comprised of an insulator.

5. A method of depositing Ge according to claim 1, further comprising, before step a), the steps of:
   immersing said substrate in about a 5:1:1 solution of $H_2O$:$H_2O_2$:$NH_4OH$ at about 65° C. for about 1 minute;
   rinsing said substrate with deionized $H_2O$;
   immersing said substrate in about a 5:1:1 solution of $H_2O$:$H_2O_2$:HCl at about 65° C. for about 1 minute; and,
   rinsing said substrate with deionized $H_2O$.

6. A method of nonselectively depositing Ge onto a substrate in an ultra high vacuum chemical vapor deposition (UHV/CVD) system, the UHV/CVD system comprising a reaction chamber and a load lock chamber, said method comprising the steps of:
   a) immersing said substrate in about a 5:1:1 solution of $H_2O$:$H_2O_2$:$NH_4OH$ at about 65° C. for about 1 minute;
   b) rinsing said substrate with deionized $H_2O$;
   c) immersing said substrate in about a 5:1:1 solution of $H_2O$:$H_2O_2$:HCl at about 65° C. for about 1 minute;
   d) rinsing said substrate with deionized $H_2O$;
   e) immersing said substrate in about a 10:1 solution of $H_2O$:HF at room temperature for about 10 to 15 seconds;
   f) placing said substrate into said load lock chamber and pre-evacuating said load lock chamber to a pressure of approximately 10 to 50 mTorr and then subsequently evacuating said load lock chamber quickly to a pressure of approximately $10^{-7}$ Torr;
   g) evacuating said reaction chamber to a pressure below $10^{-7}$ Torr;
   h) bleeding hydrogen ($H_2$) into said reaction chamber at a rate of approximately 650 sccm;
   i) opening said load lock chamber to said reaction chamber and transferring the substrate from said load lock chamber to said reaction chamber, whereby the bleeding of the $H_2$ of the previous step reduces cross contamination between said load lock chamber and said reaction chamber during the transferring of said substrate from said load lock chamber to said reaction chamber;
   j) heating said reaction chamber and said substrate to a temperature on the order of 300° to 600° C.; and,
   k) stopping the bleeding of $H_2$ and providing a mixture of $GeH_4$, He, and $B_2H_6$ gas in said reaction chamber, wherein a flow of $GeH_4$ and He is at a rate of approximately 10 to 25 sccm to produce a partial pressure of $GeH_4$ on the order of 2 to 50 mTorr and a flow of $B_2H_6$ is at a rate sufficient to produce a partial pressure of $B_2H_6$ on the order of 0.08 to 2 mTorr, the mixture thereby having a partial pressure ratio of $GeH_4$ to $B_2H_6$ on the order of 25:1.

7. A method of depositing Ge according to claim 6, wherein said substrate is comprised of Si.

8. A method of depositing Ge according to claim 6, wherein said substrate is comprised of an insulator.

* * * * *